United States Patent
Shiozawa et al.

(10) Patent No.: US 7,910,495 B2
(45) Date of Patent: Mar. 22, 2011

(54) PLASMA OXIDIZING METHOD, PLASMA PROCESSING APPARATUS, AND STORAGE MEDIUM

(75) Inventors: Toshihiko Shiozawa, Amagasaki (JP); Yoshiro Kabe, Amagasaki (JP); Takashi Kobayashi, Amagasaki (JP); Hikaru Adachi, Amagasaki (JP); Junichi Kitagawa, Amagasaki (JP); Nobuhiko Yamamoto, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 129 days.

(21) Appl. No.: 12/443,589

(22) PCT Filed: Sep. 27, 2007

(86) PCT No.: PCT/JP2007/068755
§ 371 (c)(1),
(2), (4) Date: Mar. 30, 2009

(87) PCT Pub. No.: WO2008/041600
PCT Pub. Date: Apr. 10, 2008

(65) Prior Publication Data
US 2010/0015815 A1   Jan. 21, 2010

(30) Foreign Application Priority Data

Sep. 29, 2006  (JP) .................................. 2006-267744
Mar. 30, 2007  (JP) .................................. 2007-091701

(51) Int. Cl.
*H01L 21/469* (2006.01)

(52) U.S. Cl. ......... 438/772; 257/E21.079; 257/E21.282; 257/E21.301; 438/770; 438/771

(58) Field of Classification Search ........................ None
See application file for complete search history.

(56) References Cited

U.S. PATENT DOCUMENTS

| 6,800,512 | B1 | 10/2004 | Itonaga et al. | |
|---|---|---|---|---|
| 7,381,595 | B2 * | 6/2008 | Joshi et al. ................... | 438/149 |
| 7,816,188 | B2 * | 10/2010 | Vyvoda et al. ................ | 438/131 |
| 2004/0142577 | A1 | 7/2004 | Sugawara et al. | |
| 2004/0224450 | A1 | 11/2004 | Itonaga et al. | |
| 2005/0233599 | A1 | 10/2005 | Sugawara et al. | |
| 2008/0146041 | A1 * | 6/2008 | Sasaki ......................... | 438/772 |

FOREIGN PATENT DOCUMENTS

| JP | 2001 156059 | 6/2001 |
|---|---|---|
| JP | 2002 280369 | 9/2002 |
| WO | 02 058130 | 7/2002 |

* cited by examiner

*Primary Examiner* — Asok K Sarkar
(74) *Attorney, Agent, or Firm* — Oblon, Spivak, McClelland, Maier & Neustadt, L.L.P.

(57) ABSTRACT

A plasma oxidizing method includes a step of placing an object to be processed and having a surface containing silicon on a susceptor disposed in a processing vessel of a plasma processing apparatus, a step of producing a plasma from a processing gas containing oxygen in the processing vessel, a step of supplying high-frequency electric power to the susceptor and applying a high-frequency bias to the object to be processed when the plasma is produced, and a step of forming a silicon oxide film by oxidizing silicon in the surface of the object to be processed by the plasma.

12 Claims, 10 Drawing Sheets

PLASMA OXIDIZING METHOD, PLASMA PROCESSING APPARATUS, AND STORAGE MEDIUM

FIELD OF THE INVENTION

The present invention relates to a plasma oxidizing method, and more particularly to a plasma oxidizing method, which is applicable to, e.g., the formation of a silicon oxide film serving as an insulating film in a manufacturing process of various semiconductor devices.

BACKGROUND OF THE INVENTION

In a manufacturing process of various semiconductor devices, a silicon oxide film, such as $SiO_2$, is formed as an insulating film, e.g., a gate insulating film of a transistor. In order to form such a silicon oxide film, a thermal oxidation process using an oxidation furnace or a rapid thermal process (RTP) apparatus is used. In a wet oxidation process using an oxidation furnace, which is one of the thermal oxidation processes, a silicon substrate is heated to a temperature exceeding 800° C. and exposed to an oxidizing atmosphere of water vapor ($H_2O$) by using a water vapor generator (WVG), which generates vapor ($H_2O$) through the combustion of oxygen and hydrogen, thereby oxidizing a surface of the silicon substrate to form a silicon oxide film.

The thermal oxidation process is considered as a process of forming a silicon oxide film of a good quality. However, the thermal oxidation process requires a high temperature exceeding 800° C., and thus causes problems, such as the increase of a thermal budget, the distortion of a silicon substrate due to thermal stress, or the like.

On the other hand, there is proposed an oxide film forming method as a technique capable of avoiding the increase of the thermal budget or the distortion of the silicon substrate in the thermal oxidation process (see, e.g., WO2001/69673). In this method, an oxidation process is performed on the surface of an electronic device mainly containing silicon by using a microwave-excited plasma, which is formed at a pressure of 133.3 Pa in a chamber using a processing gas including Ar gas and oxygen gas, the proportion of the flow rate of oxygen in the processing gas being approximately 1%. Accordingly, it is possible to form a silicon oxide film having a good quality and easily controlled film thickness.

In case that the plasma process is carried out under the condition that the process pressure is approximately 133.3 Pa and the proportion of the flow rate of $O_2$ in the processing gas is 1% (for convenience of description, referred to as a low-pressure and low-oxygen concentration condition), for example, when a pattern, such as lines and spaces formed on an object to be processed, has dense and sparse portions, there is a difference of forming speeds of the silicon oxide film between dense portions and sparse portions, and it is difficult to form the silicon oxide film with a uniform thickness. If the thickness of the silicon oxide film varies according to the portions of the film, the reliability of a semiconductor device using the silicon oxide film as an insulating film may be lowered.

In order to solve this problem, the plasma oxidation process is carried out under the condition that the process pressure is approximately 667 Pa and the proportion of the flow rate of $O_2$ in the processing gas is approximately 25% (for convenience of description, referred to as a high-pressure and high-oxygen concentration condition). In this case, however, when a silicon oxide film is formed on a pattern having prominences and depressions, an oxidation rate at a dense portion is lowered, and corners of the upper ends of the prominences are not sufficiently rounded. Thus, leakage current due to electric field concentration on these portions or cracks due to stress of the silicon oxide film may be generated.

That is, in case that a silicon oxide film is formed by the plasma oxidation process, it is required to round corners of the upper ends of prominences of the pattern and also to form the silicon oxide film having a uniform film thickness regardless of the density of the pattern.

Further, an oxide film requires two electrical characteristics, i.e., a time zero dielectric breakdown (TZDB) characteristic and a time-dependent dielectric breakdown (TDDB) characteristic, and it is required that both these insulating properties are good.

SUMMARY OF THE INVENTION

It is an object of the present invention to provide a plasma oxidizing method capable of forming a silicon oxide film, which does not generate a film thickness difference due to the density of a pattern, allows corners of upper ends of prominences of the pattern to be rounded, and obtains a uniform film thickness.

It is another object of the present invention to provide a plasma oxidizing method capable of forming a silicon oxide film, which has excellent time zero dielectric breakdown (TZDB) characteristic and excellent time-dependent dielectric breakdown (TDDB) characteristic.

In accordance with a first aspect of the present invention, there is provided a plasma oxidizing method comprising: mounting an object to be processed, having a surface containing silicon, on a mounting table disposed in a processing chamber of a plasma processing apparatus; forming a plasma of a processing gas including oxygen in the processing chamber; applying a high frequency bias to the object by supplying a high frequency power to the mounting table in formation of the plasma; and forming a silicon oxide film by oxidizing the silicon in the surface of the object by using the plasma.

In the first aspect, the plasma may be formed under the condition that a proportion of oxygen in the processing gas is 10% or more and a process pressure is 266 Pa to 1,333 Pa.

An output of the high frequency power may be 0.015 to 5 $W/cm^2$ per unit area of the object. Further, a frequency of the high frequency power may range from 300 kHz to 60 MHz.

Further, the plasma may be a microwave-excited plasma formed by exciting the processing gas by using a microwave introduced into the processing chamber by a planar antenna having plural slots.

In accordance with a second aspect of the present invention, there is provided a plasma oxidizing method comprising: mounting an object to be processed, having a surface containing silicon, on a mounting table disposed in a processing chamber of a plasma processing apparatus; forming a plasma in the processing chamber, under the condition that a proportion of oxygen in a processing gas is 10% or more and a process pressure ranges from 266 Pa to 1,333 Pa, by radiating a microwave from a planar antenna having plural slots into the processing chamber and introducing the processing gas including oxygen into the processing chamber, simultaneously; applying a high frequency bias to the object by supplying a high frequency power to the mounting table in formation of the plasma; and forming a silicon oxide film by oxidizing the silicon in the surface of the object by using the plasma.

In the second aspect, the high frequency bias may be controlled such that a time zero dielectric breakdown (TZDB) characteristic and a time-dependent dielectric breakdown (TDDB) characteristic of the formed silicon oxide film respectively have desired values.

An output of the high frequency power may be 0.015 to 5 W/cm$^2$ per unit area of the object. Further, a frequency of the high frequency power may range from 300 kHz to 60 MHz.

In the first and second aspects, the surface of the object may have an uneven pattern with prominences and depressions. Further, the proportion of oxygen in the processing gas may range from 10 to 50%. Further, the processing gas may include hydrogen in a proportion of 0.1 to 10%. Further, a process temperature may range from 200 to 800° C.

Further, the uneven pattern formed on the surface of the object may include sparse and dense portions having sparse and dense prominences and depressions.

Further, the silicon oxide film may be formed such that a ratio ($t_c/t_s$) of a film thickness $t_c$ of the silicon oxide film formed at corners of upper ends of prominences of the uneven pattern to a film thickness $t_s$ of the silicon oxide film formed at side surfaces of the prominences is 0.9 or more.

In accordance with a third aspect of the present invention, there is provided a plasma oxidizing method comprising: applying a high frequency bias to an object to be processed having a surface containing silicon; and forming a silicon oxide film by oxidizing the silicon in the surface of the object by using a plasma of a processing gas including oxygen generated while applying the high frequency bias, wherein a power density of the high frequency bias ranges from 0.015 to 5 W/cm$^2$ in application of the high frequency bias to the object.

In accordance with a fourth aspect of the present invention, there is provided a plasma processing apparatus comprising: a processing chamber which accommodates an object to be processed; a processing gas supply unit which supplies a processing gas including oxygen into the processing chamber; a gas exhaust unit which evacuates the processing chamber to form a vacuum in the processing chamber; a plasma generating unit which generates a plasma of the processing gas in the processing chamber; and a control unit which controls the units to form the plasma of the processing gas including oxygen in the processing chamber in a state where the object having a surface containing silicon is mounted on a mounting table disposed in the processing chamber, to apply a high frequency bias to the object by supplying a high frequency power to the mounting table in formation of the plasma, and to form a silicon oxide film by oxidizing the silicon in the surface of the object by using the plasma.

In accordance with a fifth aspect of the present invention, there is provided a storage medium storing a program which runs on a computer and, when executed, controls a plasma processing apparatus to perform a plasma oxidizing method including: mounting an object to be processed, having a surface containing silicon, on a mounting table disposed in a processing chamber of the plasma processing apparatus; forming a plasma of a processing gas including oxygen in the processing chamber; applying a high frequency bias to the object by supplying a high frequency power to the mounting table in formation of the plasma; and forming a silicon oxide film by oxidizing the silicon in the surface of the object by using the plasma.

In accordance with the aspects of the present invention, a plasma is generated by supplying a high frequency power to a mounting table on which is an object to be processed is mounted and applying a bias voltage to the object, and silicon of the surface of the object having a pattern with prominences and depressions is oxidized by using the plasma. Accordingly, it is possible to allow corners of upper ends of prominences of the pattern to be rounded without generating a film thickness difference due to the density of the pattern. Therefore, it is possible to suppress charge-up damage and to form a silicon oxide film having a uniform firm thickness on the silicon surface having a pattern with prominences and depressions at a high oxidation rate.

Further, in accordance with the aspects of the present invention, a plasma is formed under the condition that a proportion of oxygen in a processing gas is 10% or more and a process pressure ranges from 266 Pa to 1,333 Pa, by supplying a high frequency bias to a mounting table, radiating a microwave from a planar antenna having plural slots into a processing chamber, and introducing the processing gas including oxygen into the processing chamber, simultaneously. A silicon oxide film is formed by oxidizing silicon of the surface of an object to be processed by using the plasma. Accordingly, it is possible to form the silicon oxide film having excellent time zero dielectric breakdown (TZDB) characteristic and excellent time-dependent dielectric breakdown (TDDB) characteristic and a high electrical reliability.

Therefore, the silicon oxide film obtained by the method of the present invention provides excellent electrical characteristics to a semiconductor device using the silicon oxide film as an insulating film and also improves the reliability of the semiconductor device.

DETAILED DESCRIPTION OF THE EMBODIMENTS

Figure 1:
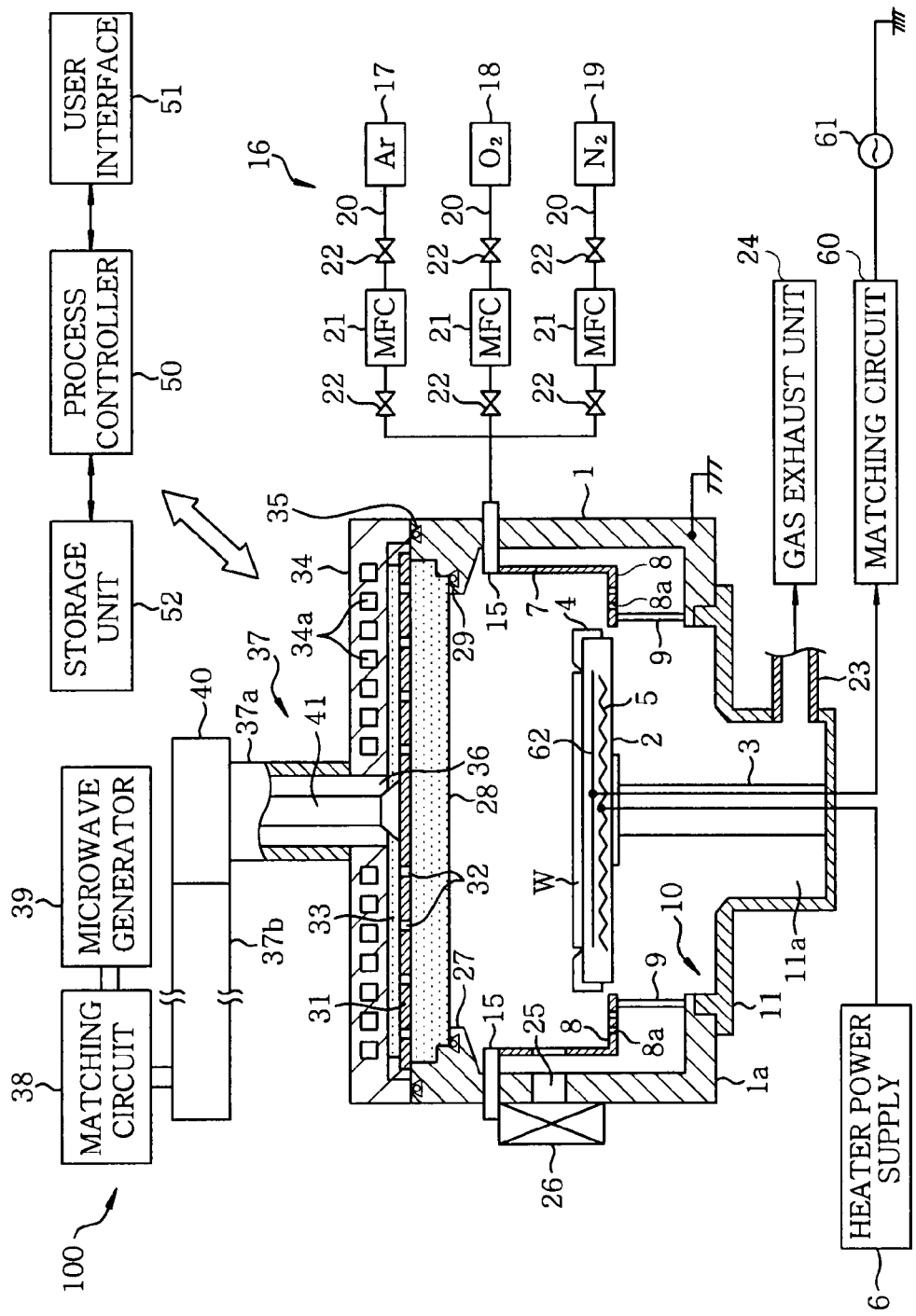
FIG. 1 is a schematic cross sectional view illustrating one example of a plasma processing apparatus suitable for the execution of a method in accordance with the present invention.

Hereinafter, embodiments of the present invention will be described in detail with reference to the accompanying drawings which form a part hereof. FIG. 1 is a schematic cross sectional view illustrating one example of a plasma processing apparatus suitable for the execution of a silicon oxide film forming method in accordance with the present invention. The plasma processing apparatus is configured as a radial line slot antenna (RLSA) microwave plasma processing apparatus which introduces a microwave from a planar antenna with many slots, particularly a RLSA, into a processing chamber to generate a microwave plasma having a high density and a low electron temperature. The plasma processing apparatus may be suitably used to form insulating films of various semiconductor devices, e.g., a gate insulating film of a transistor.

The plasma processing apparatus 100 includes an approximately cylindrical chamber 1, which is airtightly sealed and grounded. A circular opening 10 is formed at an approximately central portion of a bottom wall 1a of the chamber 1. A gas exhaust chamber 11, which is connected to the opening 10 and is protruded downwardly, is installed on the bottom wall 1a.

A susceptor (mounting table) 2 made of ceramic such as AlN is installed in the chamber 1 to horizontally support a substrate to be processed, i.e., a semiconductor wafer W. The susceptor 2 is supported by a cylindrical support member 3 which is made of ceramic such as AlN and is extended upwardly from a central bottom potion of the gas exhaust chamber 11. A guide ring 4 for guiding the wafer W is installed at an outer peripheral portion of the susceptor 2. Further, a resistance heater 5 is embedded in the susceptor 2. The resistance heater 5 is supplied with power from a heater power supply 6 to heat the susceptor 2, thereby heating the wafer W. In this case, a process temperature can be controlled within a range, for example, from a room temperature to 800° C.

Further, a high frequency bias power supply 61 is connected to the susceptor 2 via a matching circuit 60. Specifically, an electrode 62 is embedded in the susceptor 2, and the high frequency power supply 61 is connected to the electrode 62 such that a high frequency power can be supplied to the susceptor 2. The electrode 62 is made of a conductor having a thermal expansion coefficient which is equal to or close to that of an AlN ceramic member, e.g., a conductive material such as molybdenum and tungsten, and is formed in a shape, e.g., a net shape, a lattice shape, a vertex shape, or the like.

The high frequency power supply 61 applies a high frequency power having a predetermined frequency of, e.g., 300 kHz to 60 MHz, preferably, 400 kHz to 27 MHz, a power density of, e.g., 0.015 to 11.5 W/cm$^2$, preferably, 0.015 to 5 W/cm$^2$ per unit area of the wafer, and a power of 5 to 3,600 W.

Wafer supporting pins (not shown) are provided in the susceptor 2 to be protruded from the surface of the susceptor 2 and retracted into the susceptor 2, thereby supporting and moving the wafer W up and down.

A cylindrical liner 7 made of quartz is installed at an inner periphery of the chamber 1. A baffle plate 8, which is made of quartz and has a plurality of gas exhaust holes 8a, is installed in a ring shape at an outer periphery of the susceptor 2 to uniformly evacuate the chamber 1. The baffle plate 8 is supported by plural pillars 9.

A gas inlet member 15 having a ring shape is provided at a sidewall of the chamber 1, and gas inlet holes are uniformly formed through the gas inlet member 15. A gas supply system 16 is connected to the gas inlet member 15. The gas inlet member 15 may have a showerhead shape. For example, the gas supply system 16 includes an Ar gas supply source 17, an O$_2$ gas supply source 18 and a H$_2$ gas supply source 19. Ar, O$_2$ and H$_2$ gases reaching the gas inlet member 15 via respective gas lines 20 are uniformly introduced into the chamber 1 through the gas inlet holes of the gas inlet member 15. Each of the gas lines 20 is provided with a mass flow controller 21 and valves 22 located at the front and rear of the mass flow controller 21. The Ar gas may be replaced by another rare gas, e.g., Kr gas, He gas, Ne gas, Xe gas or the like, and the rare gas may be omitted, when oxidizing gas of 100% is used, as will be described later.

A gas exhaust pipe 23 is connected to the side surface of the gas exhaust chamber 11, and a gas exhaust unit 24 including a high speed vacuum pump is connected to the gas exhaust pipe 23. As the gas exhaust unit 24 is operated, the gas in the chamber 1 uniformly moves to a space 11a of the gas exhaust chamber 11 and is discharged through the gas exhaust pipe 23. Accordingly, the inner pressure of the chamber 1 may be rapidly lowered down to a predetermined vacuum level of, e.g., 0.133 Pa.

At the sidewall of the chamber 1, there are provided a loading/unloading port 25 through which the wafer W is delivered between the chamber 1 and a transfer chamber (not shown) adjacent to the plasma processing apparatus 100, and a gate valve 26 for opening and closing the loading/unloading port 25.

An opening is formed at an upper portion of the chamber 1, and a support part 27 having a ring shape is installed along the circumference of the opening. A microwave transmitting plate 28, which is made of a dielectric, for example, ceramic such as quartz or Al$_2$O$_3$ and transmits a microwave, is airtightly installed at the support part 27 through a seal member 29. Therefore, the inside of the chamber 1 can be maintained in a hermetically sealed state.

Figure 2:
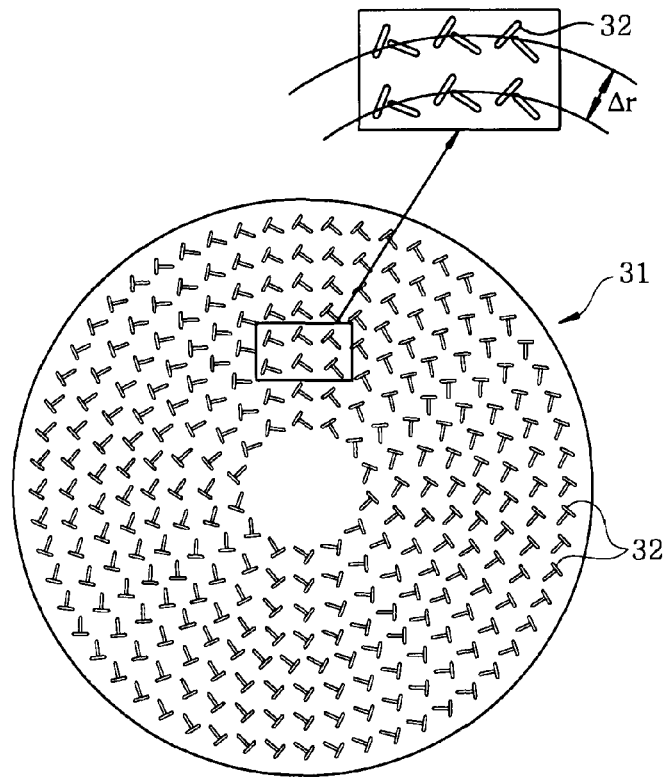
FIG. 2 illustrates the structure of a planar antenna plate.

A planar antenna plate 31 having a circular plate shape is installed above the microwave transmitting plate 28 to face the susceptor 2. The planar antenna plate 31 is suspended on the upper end of the sidewall of the chamber 1. When the wafer W has a size of, e.g., 8 inches, the planar antenna plate 31 is configured as a circular plate, which has a diameter of 300 to 400 mm and a thickness of 1 to several mm (e.g., 1 mm) and is made of a conductive material. Specifically, the planar antenna plate 31 is formed of a silver or gold plated steel plate or an aluminum plate, and a plurality of microwave radiation holes (slots) 32 are formed in a specific pattern through the planar antenna plate 31. The planar antenna plate 31 may be formed of a nickel plate or a stainless steel plate. As shown in FIG. 2, the microwave radiation holes 32 have pairs of long slots, wherein each pair of the microwave radiation holes 32 are generally arranged in a "T" shape. The pairs of the microwave radiation holes 32 are arranged in plural concentric circles. The length and arrangement interval of the microwave radiation holes 32 depend on the wavelength (λg) of the microwave. For example, the microwave radiation holes 32 may be arranged at intervals of λg/4, λg/2 or λg. In FIG. 2, an interval between adjacent microwave radiation holes 32 on different concentric circles is represented by Δr. Also, the microwave radiation holes 32 may have a circular shape, a circular arc shape or the like. No particular limitation is imposed on the arrangement of the microwave radiation holes 32. For example, the microwave radiation holes 32 may be arranged in a spiral or radial pattern in addition to the concentric circular pattern.

A wave retardation member 33, which is made of a dielectric material having a dielectric constant larger than that of a vacuum (equal to or larger than 1), e.g., quartz, is installed on the upper surface of the planar antenna plate 31. The wave retardation member 33 may be made of resin, such as polytetrafluorethylene or polyimide. Since the microwave has a longer wavelength in a vacuum, the wave retardation member 33 functions to shorten the wavelength of the microwave to control the plasma. Further, the planar antenna member 31 may be in contact with or separated from the transmitting plate 28 and the wave retardation member 33.

A shield lid 34, which is made of metal such as aluminum, stainless steel or copper, is installed on the upper surface of the chamber 1 to cover the planar antenna plate 31 and the wave retardation member 33. The shield lid 34 serves as a portion of a waveguide, and uniformly transmits a microwave in a radial shape. The upper surface of the chamber 1 and the shield lid 34 are sealed with a seal member 35. Cooling water paths 34a are formed in the shield lid 34, and cooling water flows through the cooling water paths 34a to cool the shield lid 34, the wave retardation member 33, the planar antenna plate 31 and the microwave transmitting plate 28. Accordingly, it is possible to prevent the deformation or the breakage of the shield lid 34, the wave retardation member 33, the planar antenna plate 31, and the microwave transmitting plate 28, thereby allowing a plasma to be stably generated. Further, the shield lid 34 is grounded.

An opening 36 is formed at the center of an upper wall of the shield lid 34, and a waveguide 37 is connected to the opening 36. A microwave generator 39 is connected to the end of the waveguide 37 via a matching circuit 38. Accordingly, a microwave generated from the microwave generator 39 and having a frequency of, e.g., 2.45 GHz is propagated to the planar antenna plate 31 via the waveguide 37. Further, the microwave may have a frequency of 8.35 GHz, 1.98 GHz, or the like.

The waveguide 37 includes a coaxial waveguide 37a having a circular cross sectional shape, which is extended upwardly from the opening 36 of the shield lid 34, and a rectangular waveguide 37b, which is connected to the upper end of the coaxial waveguide 37a via a mode converter 40 and is extended in the horizontal direction. The mode converter 40 provided between the coaxial waveguide 37a and the rectangular waveguide 37b functions to convert a microwave propagating in a TE mode through the rectangular waveguide 37b into a TEM mode microwave. An internal conductor 41 is provided at the center of the coaxial waveguide 37a, and a lower end of the internal conductor 41 is fixed to the center of the planar antenna plate 31. Accordingly, the microwave is uniformly and efficiently propagated to the planar antenna plate 31 via the internal conductor 41 of the coaxial waveguide 37a.

Each component of the plasma processing apparatus 100 is connected to and controlled by a process controller 50 having a micro processor (computer). A user interface 51, including a keyboard for inputting commands or a display for displaying an operation status of the plasma processing apparatus 100, is connected to the process controller 50 to allow a process manager to manage the plasma processing apparatus 100.

Further, the process controller 50 is connected to a storage unit 52 which stores recipes including control programs for implementing various processes in the plasma processing apparatus 100 under control of the process controller 50, or a program for performing a process in each component of the plasma processing apparatus 100 under process conditions. Further, the recipes can be stored in a storage medium of the storage unit 52. The storage medium may be a hard disk, a semiconductor memory, or a portable storage medium, such as a CD-ROM, a DVD, or a flash memory. Further, the recipes may properly be transmitted from another apparatus via, e.g., a dedicated line.

If necessary, as a certain recipe is retrieved from the storage unit 52 in accordance with an instruction inputted through the user interface 51 and transmitted to the process controller 50, a desired process is performed in the plasma processing apparatus 100 under control of the process controller 50.

The plasma processing apparatus 100 having the above configuration can provide a film having good quality by performing a damage-free plasma process even at a low temperature of 800° C. or less, and preferably 500° C. or less while achieving both excellent plasma uniformity and process uniformity.

The plasma processing apparatus 100 may be applied to a case in which a silicon oxide film is formed as a gate insulating film of a transistor as described above, and a case (liner oxidation) in which an oxide film is formed in a trench in a shallow trench isolation (STI) process for device isolation in a manufacturing process of a semiconductor device.

Now, an oxidation process of a trench (depression) using the plasma processing apparatus 100 will be described. First, the gate valve 26 is opened, and a wafer W having a trench (depression) is loaded into the chamber 1 through the loading/unloading port 25 to be mounted on the susceptor 2.

Thereafter, Ar gas and $O_2$ gas are supplied into the chamber 1 from the Ar gas supply source 17 and the $O_2$ gas supply source 18 of the gas supply system 16 at predetermined flow rates via the gas inlet member 15, and the chamber 1 is maintained at a specific process pressure. In this case, a proportion of oxygen in the processing gas is, preferably, 10% or more, e.g., 10 to 50%, more preferably 20 to 30%. The amount of oxygen ions or oxygen radicals in the plasma can be controlled by adjusting the proportion of oxygen in the processing gas, as described above. Thus, even when the silicon surface of the wafer W has a pattern of, e.g., prominences and depressions or grooves, the amount of oxygen ions or oxygen radicals reaching depressions is controlled by adjusting the partial pressure of an oxygen gas, thereby forming a silicon oxide film having a uniform thickness.

The gas flow rates of the processing gas may be selected within a range of Ar gas of 0 to 5,000 mL/min and a range of $O_2$ gas of 10 to 1500 mL/min, such that the proportion of oxygen to a total flow rate of the processing gas meets the above condition.

Further, in addition to Ar gas and $O_2$ gas from the Ar gas supply source 17 and the $O_2$ gas supply source 18, $H_2$ gas from the $H_2$ gas supply source 19 may be introduced into the chamber 1 at a predetermined proportion. An oxidation rate in the plasma oxidation process can be improved by supplying $H_2$ gas. When $H_2$ gas is supplied, OH radicals are generated and contribute to the improvement of the oxidation rate. In this case, the proportion of $H_2$ gas in the total amount of the processing gas needs to be 0.1 to 10%, more preferably 0.1 to 5%, and desirably 0.1 to 2%. The flow rate of $H_2$ gas is preferably 1 to 650 mL/min(sccm).

A process pressure in the chamber 1 is preferably 266 to 1,333 Pa, and more preferably 533 to 733 Pa.

Further, a process temperature may be selected within a range of 200 to 800° C., preferably 400 to 500° C.

Thereafter, the microwave from the microwave generator 39 is guided to the waveguide 37 via the matching circuit 38. The microwave sequentially passes through the rectangular waveguide 37b, the mode converter 40 and the coaxial waveguide 37a and is supplied to the planar antenna plate 31. The microwave is propagated in the TE mode within the rectangular waveguide 37b, and the TE mode microwave is converted into a TEM mode microwave in the mode converter 40. The TEM mode microwave is propagated within the coaxial waveguide 37a toward the planar antenna plate 31. The microwave is radiated from the planar antenna plate 31 to a space above the wafer W in the chamber 1 through the microwave transmitting plate 28. Preferably, the microwave generator 39 is set at a power density of 0.41 to 4.19 W/cm$^2$ and at a power level of 0.5 to 5 kW.

While the plasma oxidation process is carried out, a high frequency bias (high frequency power) is supplied from the high frequency power supply 61 to the susceptor 2 at predetermined frequency and power. The high frequency bias from the high frequency power supply 61 is supplied to suppress charge-up damage and to effectively round a silicon oxide film at corners of the upper ends of the prominences of the pattern having prominences and depressions while the plasma is maintained to have a low electron temperature (1.2 eV or less around the wafer W). Further, the high frequency bias is supplied to improve the reliability of the insulating properties of the silicon oxide film, specifically, the time zero dielectric breakdown (TZDB) characteristic and the time-dependent dielectric breakdown (TDDB) characteristic.

From these viewpoints, the frequency of the high frequency power ranges, e.g., from 300 kHz to 60 MHz, more preferably from 450 kHz to 13.56 MHz, in order to round the silicon oxide film at corners of the prominences. Further, the frequency of the high frequency power ranges preferably from 300 kHz to 27 MHz in order to improve the time zero dielectric breakdown (TZDB) characteristic and the time-dependent dielectric breakdown (TDDB) characteristic. The power of the high frequency power ranges preferably from 5 to 3,600 W, more preferably from 10 to 1,000 W, and even more preferably from 10 to 600 W. The power density of the high frequency power per unit area of the wafer ranges preferably from 0.015 to 5 W/cm$^2$, more preferably from 0.03 to 3.2 W/cm$^2$, and even more preferably from 0.03 to 0.65 W/cm$^2$.

An electromagnetic field is formed in the chamber 1 by the microwave radiated from the planar antenna plate 31 into the chamber 1 via the microwave transmitting plate 28, and Ar gas, O$_2$ gas and the like are converted into a plasma. The silicon surface exposed in the depressions of the wafer W is oxidized by the plasma. This microwave plasma is a high-density plasma having a density of approximately $1 \times 10^{10}$ to $5 \times 10^{12}$/cm$^3$ or more, which is obtained by radiating the microwave through the plural microwave radiation holes 32 of the planar antenna plate 31, and has an electron temperature of 0.5 to 2 eV and plasma density uniformity of ±5% or less. The plasma processing apparatus 100 is characterized in that the plasma is maintained to have a low electron temperature even if bias is applied to the wafer W by supplying the high frequency power from the high frequency power supply 61 to the susceptor 2.

These characteristics will be described on the basis of data.

Figure 3:
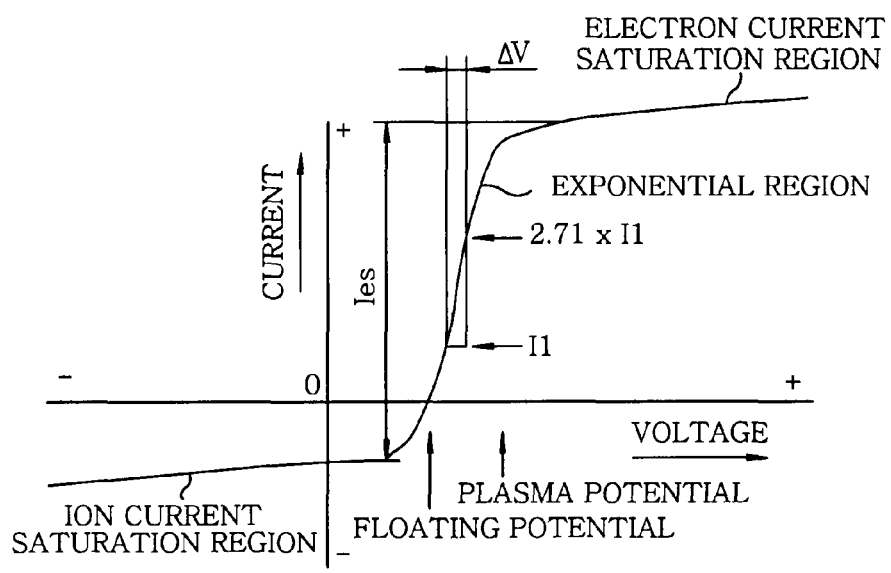
FIG. 3 illustrates a general current-voltage characteristic obtained by inserting a Langmuir probe into a plasma and sweeping an application voltage.

The electron temperature of the plasma was obtained from a current-voltage characteristic, as shown in FIG. 3, obtained by inserting a Langmuir probe into the plasma and sweeping an application voltage. Specifically, a current value I1 was obtained at a certain position in an expotential region of FIG. 3, and a voltage variation (ΔV), which increases the current value by e times (approximately 2.7 times), becomes the electron temperature (Te). Therefore, when inclinations of the expotential region are equal, the electron temperatures are equal.

Figure 4:
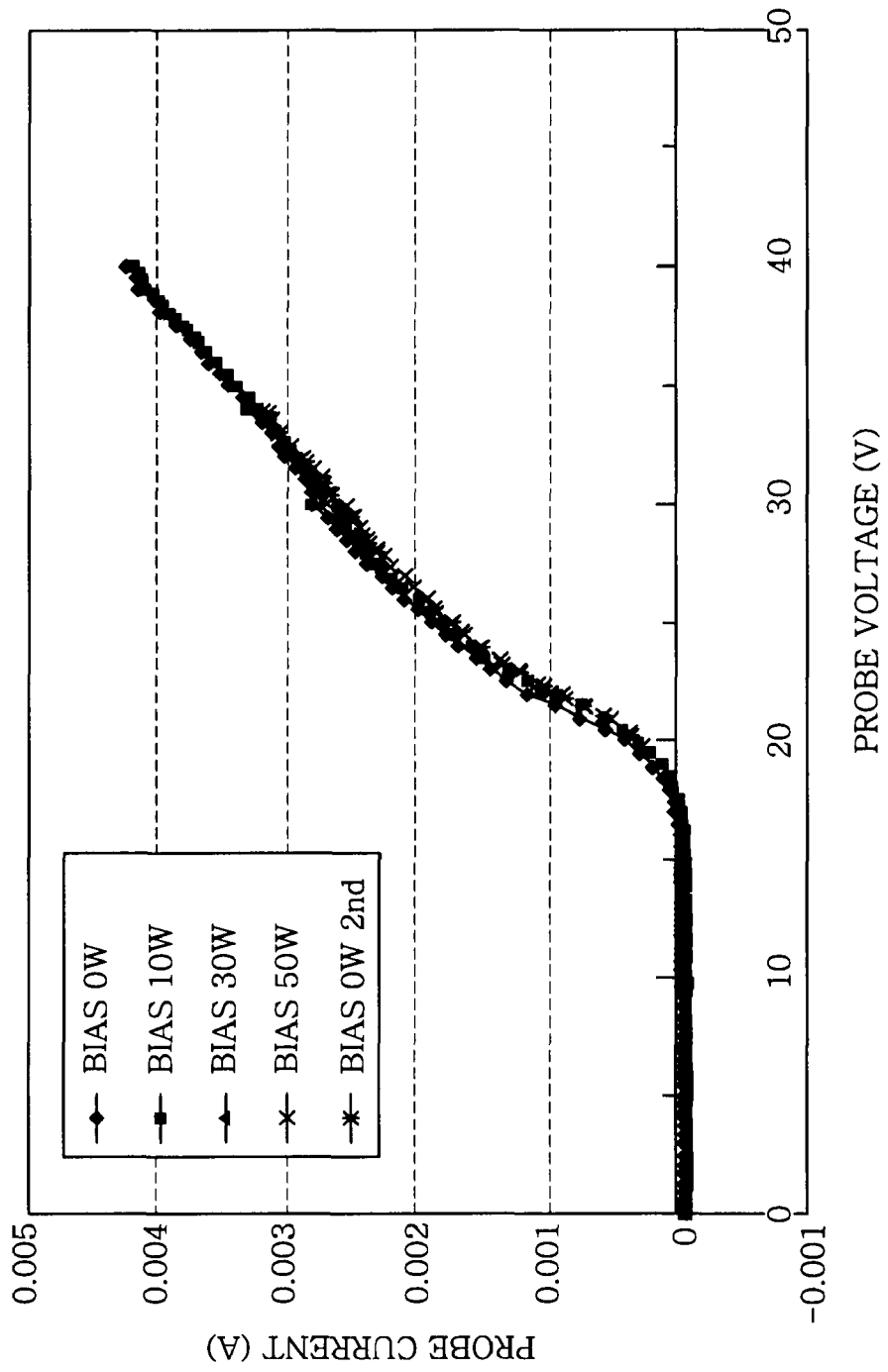
FIG. 4 illustrates a current-voltage characteristic obtained by varying a bias power.
Figure 5:
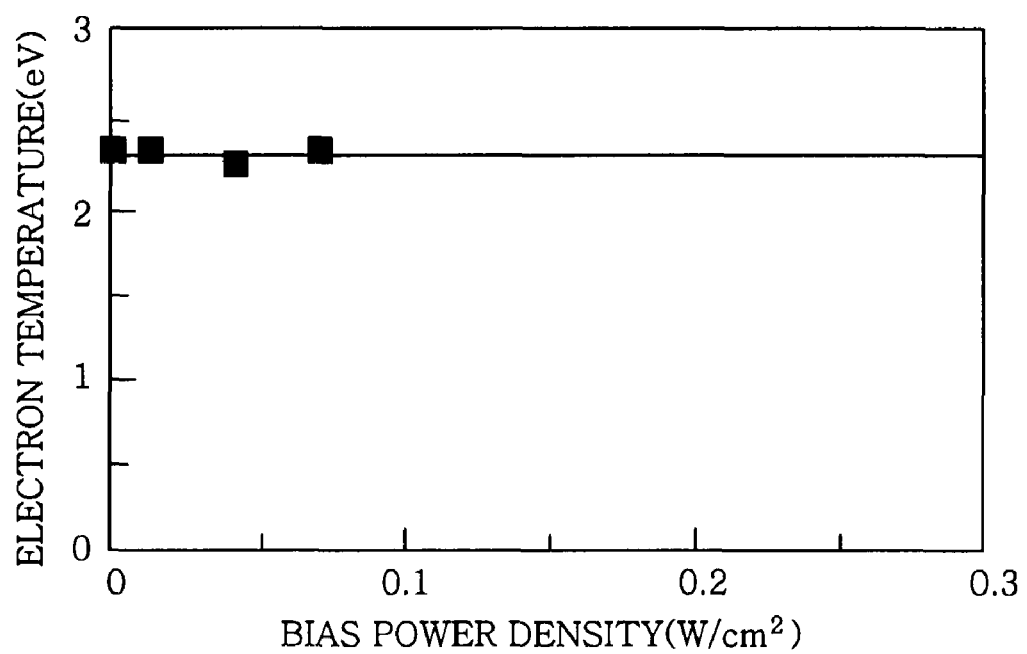
FIG. 5 illustrates a relationship between a bias power density and an electron temperature of the plasma.

Then, in the plasma processing apparatus 100 of FIG. 1, the current-voltage characteristic, when the plasma was generated by varying the high frequency bias applied to the susceptor, was measured by using the Langmuir probe. Here, a wafer of 200 mm was used, Ar gas was supplied at a flow rate of 250 mL/min(sccm), the pressure was 7.3 Pa, the microwave power was 1,000 W, and the bias power was varied to 0, 10, 30, and 50 W (the power density was respectively varied to 0.0, 0.014, 0.042, and 0.071 W/cm$^2$). Further, the area of the electrode disposed in the susceptor was 706.5 cm$^2$. FIG. 4 illustrates the obtained results. The inclination of the expotential region was approximately constant regardless of the bias power, as shown in FIG. 4, and thus the electron temperature was approximately constant, as shown in FIG. 5, without depending on the bias power (represented by the bias power density in FIG. 5). That is, although the high frequency bias is applied to the wafer W at a power density of 0.015 to 1 W/cm$^2$, the low electron temperature characteristic of the plasma can be maintained. That is, although minute bias is applied, the electron temperature of the plasma does not increase.

Therefore, although the high frequency bias is applied to the wafer W as in this embodiment, a thin and uniform oxide film can be formed by performing the oxidation process at a low temperature for a short period of time, and a silicon oxide film of good quality can be formed without substantially damaging the wafer W and the oxide film due to ions in the plasma.

The plasma oxidation process is carried out under the condition that the process pressure ranges from 266 Pa to 1,333 Pa and the proportion of oxygen in the processing gas is 10% or more, e.g., 10 to 50%. Accordingly, it is possible to form a silicon oxide film having a uniform film thickness regardless of the density of a pattern formed on the surface of an object to be processed.

Further, the high frequency bias (high frequency power) is applied from the high frequency power supply 61 to the susceptor 2 during the plasma oxidation process to attract ions in the plasma toward the wafer W. Accordingly, it is possible to form a silicon oxide film having a uniform film thickness on the silicon surface having prominences and depressions and to round the corners of the upper ends of the prominences.

As described above, in accordance with the present invention, as the plasma oxidation process is carried out while supplying the high frequency power to the susceptor 2, it is possible to round corners of the upper ends of the prominences of the silicon substrate having prominences and depressions such as trenches, as will be described later. It is also possible to form a silicon oxide film having a uniform film thickness on the surface of an object to be processed having a pattern of prominences and depressions regardless of the density of the pattern formed on the surface of the object to be processed.

In case of the above low-pressure and low-oxygen concentration condition, ion components become dominant as active species in the plasma, an electric field produced by the plasma is concentrated on corners, at which the oxide film is difficult to be grown, and the active species are attracted into the corners to accelerate the radical oxidation. Accordingly, an oxidation rate difference is generated by the density difference of the pattern, and thus it is difficult to form a uniform oxide film.

On the other hand, in case of the high-pressure and high-oxygen concentration condition, as described above, the density difference is small, but radicals of active species mainly contribute to the oxidation. Accordingly, ion assistance is insufficient to sufficiently round the corners of the prominences of the pattern. Therefore, in the present invention, the high frequency bias is applied to the susceptor 2 in addition to the above high-pressure and high-oxygen concentration condition, thereby effectively attracting active species toward the corners to accelerate the oxidation and sufficiently rounding the corners. Accordingly, it is possible to simultaneously achieve the formation of a uniform oxide film regardless of the density difference of the pattern and the sufficient rounding of the corners of the prominences of the pattern.

Further, under the high-pressure and high-oxygen concentration condition, the low electron temperature of the plasma is maintained even though the bias is applied, and thus the substrate and the oxide film formed by applying the proper high frequency bias to the substrate are rarely damaged. Further, the planarization of the interface between the silicon surface of the substrate and the oxide film is improved, and thus the oxide film does not include locally weak spots. As a result, both the time zero dielectric breakdown (TZDB) characteristic and the time-dependent dielectric breakdown (TDDB) characteristic are improved. That is, a silicon oxide film having excellent insulating properties can be obtained.

In this embodiment, as described above, a silicon oxide film having a uniform film thickness is formed regardless of the density of the pattern, the corners of the prominences of the pattern are sufficiently rounded, and both the time zero dielectric breakdown (TZDB) characteristic and the time-dependent dielectric breakdown (TDDB) characteristic are improved. Thus, it is possible to increase the reliability of the silicon oxide film. Further, a semiconductor device having good electrical characteristics can be manufactured by using the obtained silicon oxide film as an insulating film.

Figure 6:
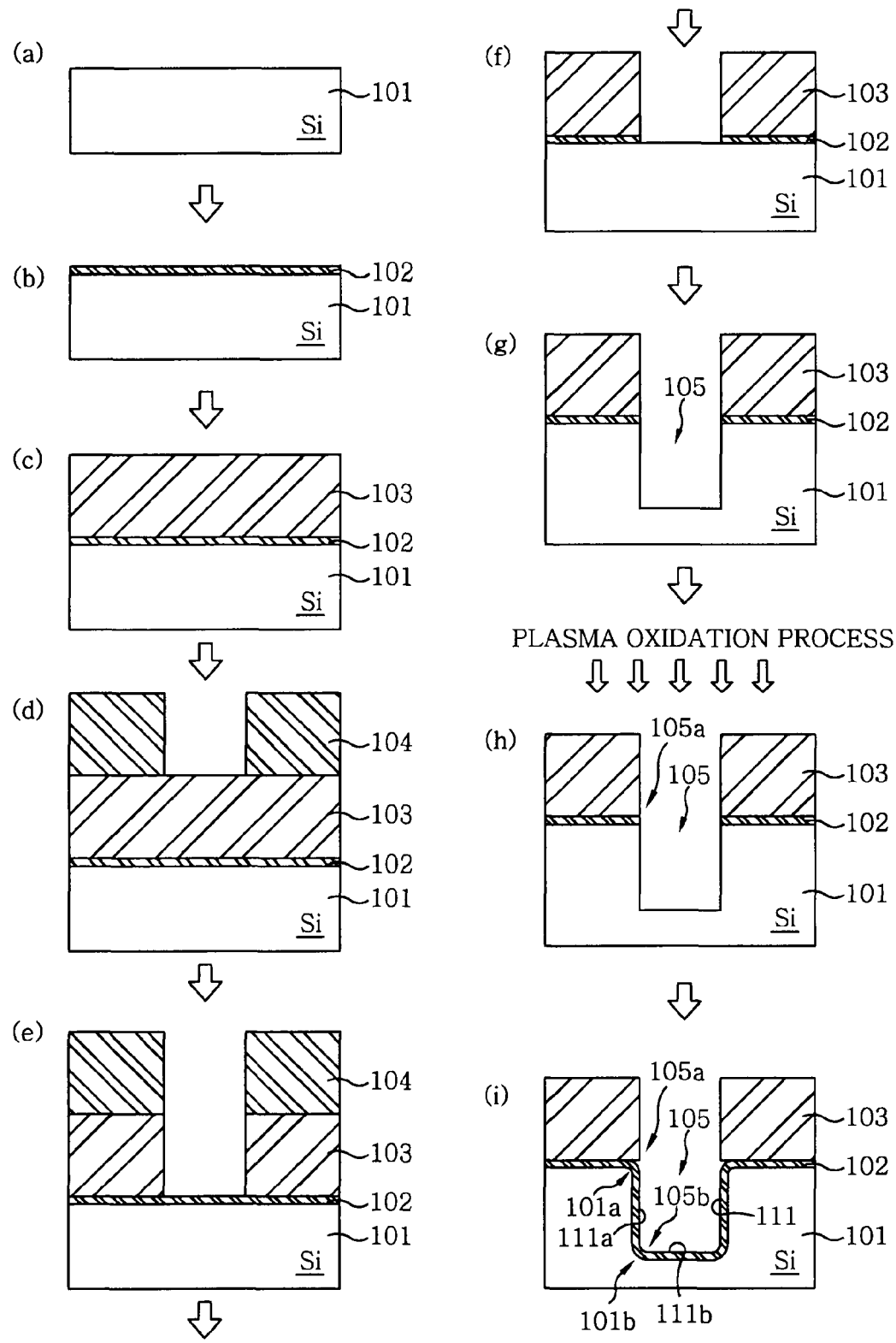
FIG. 6 illustrates a process in case that the present invention is applied to device isolation through an STI process.

Next, referring to FIG. 6, an application example of the silicon oxide film forming method of the present invention to the formation of an oxide film in trenches in the STI process will be described. FIG. 6 illustrates a process including the formation of the trenches and the formation of the silicon oxide film carried out after the formation of the trenches in the STI process.

First, as shown in (a) and (b) of FIG. 6, a silicon oxide film 102 made of $SiO_2$ is formed on a silicon substrate 101 by using, e.g., the thermal oxidation method. Thereafter, as shown in (c) of FIG. 6, a silicon nitride film 103 made of $Si_3N_4$ is formed on the silicon oxide film 102 by using, e.g., chemical vapor deposition (CVD). Thereafter, as shown in (d) of FIG. 6, a photoresist is coated on the silicon nitride film 103, and is patterned by a photolithography to form a resist layer 104.

Thereafter, as shown in (e) of FIG. 6, the silicon oxide film 102 and the silicon nitride film 103 are selectively etched through an etching mask of the resist layer 104 by using, e.g., a fluorocarbon-based etching gas to thereby expose the silicon substrate 101 corresponding to the pattern of the resist layer 104. That is, the silicon nitride film 103 forms a mask pattern for forming trenches. Further, (f) of FIG. 6 shows the state of the silicon substrate 101, in which ashing is carried out by, e.g., an oxygen containing plasma obtained by using a processing gas containing oxygen to remove the resist layer 104.

As shown in (g) of FIG. 6, the silicon substrate 101 is selectively etched by using the silicon nitride film 103 and the silicon oxide film 102 as a mask to thereby form trenches 105. The etching of the silicon substrate 101 may be carried out by using halogen or a halogen compound, such as $Cl_2$, HBr, $SF_6$ and $CF_4$, or an etching gas including $O_2$ or the like.

Next, (h) of FIG. 6 shows the formation of a silicon oxide film on the inner surfaces of the trenches 105 of the wafer W after etching in the STI process. In this case, as a high frequency power is supplied to the susceptor 2 at predetermined frequency and output, the plasma oxidation process is carried out to oxidize the inner surfaces of the trenches 105 under the condition that the proportion of oxygen in the processing gas ranges from 10 to 100%, more preferably from 20 to 50%, and the process pressure ranges from 266 to 1,333 Pa, preferably from 266 to 667 Pa. By carrying out the plasma oxidation process, as shown in (i) of FIG. 6, under the above condition, it is possible to form a uniform silicon oxide film without generating a film thickness difference between the insulating film formed at sparse portions and the insulating film formed at dense portions of the pattern of the trenches 105, even when the pattern of lines and spaces of the trenches 105 has dense and sparse portions. Further, it is possible to sufficiently round shoulder parts 101a of the silicon substrate 101 corresponding to shoulder parts 105a of the trenches 105 and corners 101b of the silicon substrate 101 corresponding to bottom corners 105b of the trenches 105. Accordingly, the generation of leakage current can be suppressed, compared with a case that these parts are formed at an acute angle.

Further, after the silicon oxide film 111 is formed by using the plasma oxidizing method of the present invention, a specific semiconductor device is manufactured by the following procedure, although not shown in the drawings. First, in accordance with the procedure of forming device isolation regions through the STI process, an insulating film made of $SiO_2$ or the like is buried in the trenches 105 by, e.g., chemical vapor deposition (CVD), and then the polarization of the silicon substrate 101 is carried out by chemical mechanical polishing (CMP) using the silicon nitride film 103 as a stopper layer. After the planarization, device isolation structures are formed by removing the silicon nitride film 103 and an upper portion of the buried insulating film by etching or chemical mechanical polishing (CMP). Thereafter, other processes are carried out by the conventional method, thereby manufacturing the specific semiconductor device.

Hereinafter, test results showing the effects of the present invention will be described.

Figure 7:
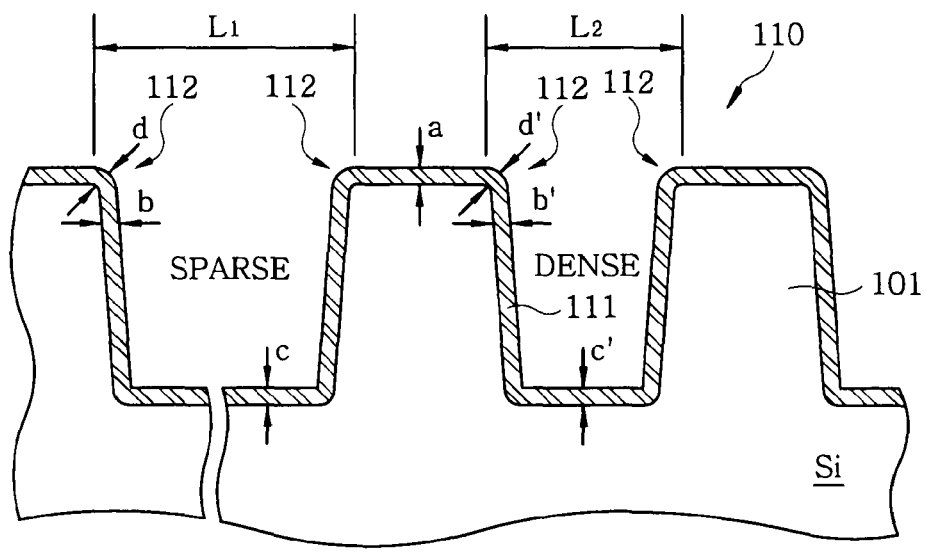
FIG. 7 is a longitudinal cross sectional view schematically showing the surface of a wafer having a pattern.

The plasma oxidizing method of the present invention was applied to the formation of an oxide film on the surface of a silicon substrate having a pattern with prominences and depressions of lines and spaces which are densely and sparsely formed. FIG. 7 schematically illustrates the cross sectional structure of an essential part of a wafer W after a silicon oxide film 111 is formed by oxidizing the surface of a silicon substrate 101 having a pattern 110 with prominences and depressions by the plasma oxidizing method of the present invention.

In this test, the plasma processing apparatus 100 of FIG. 1 was used, and silicon oxide films were formed by oxidizing the surfaces of silicon substrates, each having a pattern 110 with prominences and depressions, by the plasma oxidation process under the following conditions A to C. In the cross section of the pattern 110 of each silicon substrate, the top film thickness a of prominences of the patterns 110; the side film thickness b, the bottom film thicknesses c, and the corner film thickness d of shoulder parts 112 at sparse portions of the pattern 110; and the side film thickness b', the bottom film thickness c', and the corner film thickness d' of shoulder parts 112 at dense portions of the patterns 110 were measured. Further, in each of the patterns 110 with the prominences and depressions, a ratio ($L_1/L_2$) of an opening width $L_1$ of a depression at a sparse portion of the pattern 110 to an opening width $L_2$ of a depression at a dense portion of the pattern 110 was 50. Further, a ratio (aspect ratio) of a depth to an opening width of a depression of the pattern 110 was 0.005 at a sparse portion, and was 2 at a dense portion.

Figure 8:
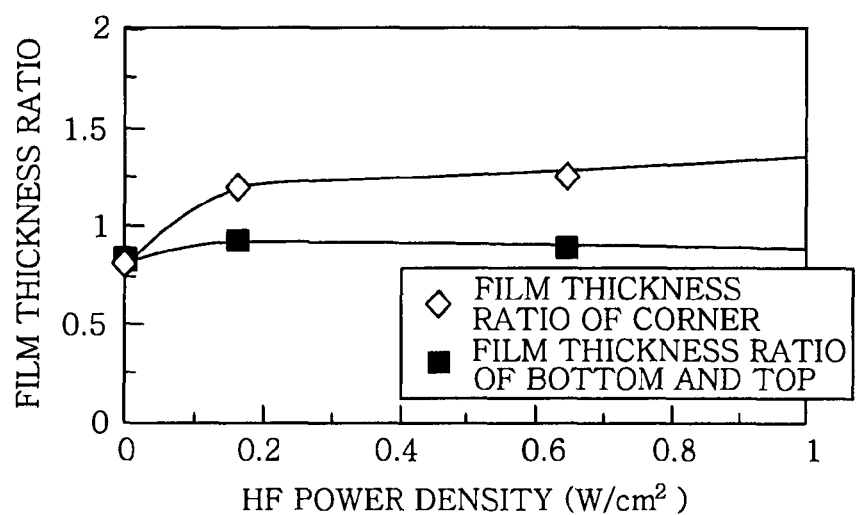
FIG. 8 is a graph illustrating a relationship between a film thickness ratio of a silicon oxide film and a high frequency power density.
Figure 9:
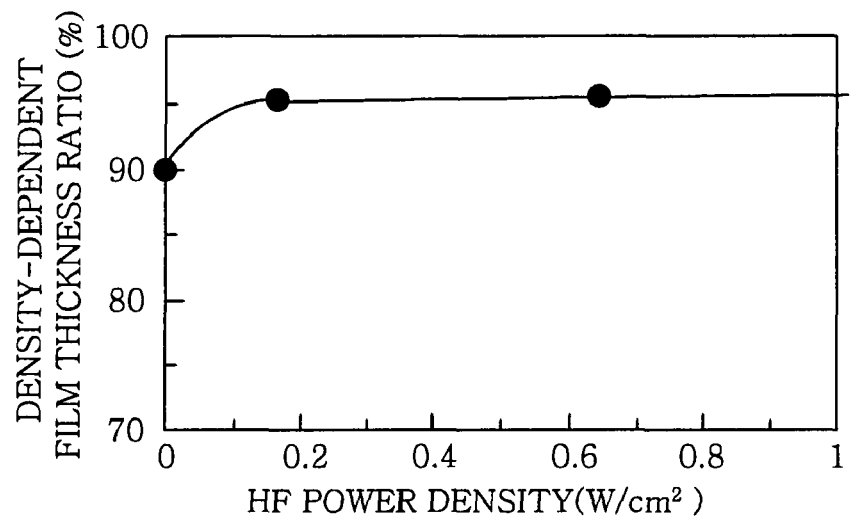
FIG. 9 is a graph illustrating a relationship between a film thickness ratio of a silicon oxide film and a high frequency power density.

Table 1 and FIGS. 8 and 9 show results of the measurement of corner film thickness ratios (film thickness d'/film thickness b') of prominences of the patterns 110, film thickness ratios (film thickness c'/film thickness a) of the bottoms to the tops of the patterns 110, and film thickness ratios ((film thickness c'/film thickness c×100) due to the density of the patterns 110.

The corner film thickness ratio (film thickness d'/film thickness b') represents a rounded degree of the shoulder parts 112 of each of the patterns 110. When the corner film thickness ratio is 0.9 or more, and preferably 1 to 1.3, the silicon oxide film 111 at the shoulder parts 112 is not thinly formed and the silicon substrate 101 at the corners is rounded. On the other hand, when the corner film thickness ratio is less than 0.9, the silicon substrate 101 at the corners is formed at an acute angle. At this time, the power density of the bias is preferably 0.015 W/cm$^2$ or more, and more preferably 0.03 W/cm$^2$ or more.

Further, the closer to 1 the film thickness ratio of the bottom to the top (film thickness c'/film thickness a) is, the better the coverage on the silicon substrate 101 is.

Further, the film thickness ratio ((film thickness c'/film thickness c)×100) due to the density is an index of a film thickness difference between sparse and dense portions of each of the patterns 110, and is preferably 90% or more, and more preferably 95% or more. At this time, the power density of the bias is preferably 0.03 W/cm$^2$ or more, and more preferably 0.15 W/cm$^2$.

Condition A

Comparison Example 1

Ar flow rate: 1,200 mL/min(sccm)
O$_2$ flow rate: 370 mL/min(sccm)
H$_2$ flow rate: 30 mL/min(sccm)
O$_2$ gas proportion: approximately 23%
Process pressure: 667 Pa (5 Torr)
Microwave power density: 1.87 W/cm$^2$
High frequency power: 0 W
Process temperature: 500° C.
Process time: 710 seconds
Obtained film thickness: 6.3 nm
Wafer diameter: 200 mm Condition B Present Invention Ar flow rate: 1,200 mL/min(sccm)
O$_2$ flow rate: 370 mL/min(sccm)
H$_2$ flow rate: 30 mL/min(sccm)
O$_2$ gas proportion: approximately 23%
Process pressure: 667 Pa (5 Torr)
Microwave power density: 1.87 W/cm$^2$
High frequency bias power (13.56 MHz): 50 W (power density of 0.15 W/cm$^2$)
Process temperature: 500° C.
Process time: 105 seconds
Obtained film thickness: 6.0 nm
Wafer diameter: 200 mm Condition C Present Invention Ar flow rate: 1,200 mL/min(sccm)
O$_2$ flow rate: 370 mL/min(sccm)
H$_2$ flow rate: 30 mL/min(sccm)
O$_2$ gas proportion: approximately 23%
Process pressure: 667 Pa (5 Torr)
Microwave power density: 1.87 W/cm$^2$
High frequency bias power (13.56 MHz): 200 W (power density of 0.637 W/cm$^2$)
Process temperature: 500° C.
Process time: 45 seconds
Obtained film thickness: 6.0 nm
Wafer diameter: 200 mm

TABLE 1

|  | Condition A (Comparison Example 1) | Condition B (Present Invention) | Condition C (Present Invention) |
| --- | --- | --- | --- |
| corner film thickness ratio (film thickness d'/film thickness b') | 0.81 | 1.20 | 1.27 |
| film thickness ratio of bottom to top (film thickness c'/film thickness a) | 0.84 | 0.92 | 0.91 |
| film thickness ratio due to density (film thickness c'/film thickness c) × 100) [%] | 90.0 | 95.3 | 95.5 |

From Table 1 and FIGS. 8 and 9, it is confirmed that the corner film thickness ratios of the silicon oxide films formed under the condition B and the condition C (the present invention) were 1.2 or more and these silicon oxide films were thickly formed. That is, the shoulder parts 112 were rounded by applying the high frequency bias to the susceptor 2. However, the corner film thickness ratio of the silicon oxide film formed under the condition A (comparison example 1), in which the high frequency bias was not applied to the susceptor 2, was 0.81, and the shoulder parts 112 were insufficiently rounded.

Further, the film thickness ratios of the bottom to the top of the silicon oxide films formed under the condition B and the condition C (the present invention), in which the high frequency bias was applied to the susceptor 2, were 0.9 or more, but the film thickness ratio of the bottom to the top of the silicon oxide film formed under the condition A (the Comparison example 1), in which the high frequency bias was not applied to the susceptor 2, was lower than those of the silicon oxide films formed under the condition B and the condition C.

Further, the film thickness ratios due to the density of the silicon oxide films formed under the condition B and the condition C (the present invention), in which the high frequency bias was applied to the susceptor 2, were 95% or more, which were even higher than that of the silicon oxide film formed under the condition A (the comparison example 1), in which the high frequency bias was not applied to the susceptor 2.

From the above test results, it is proved that the corner film thickness ratio and the film thickness ratio due to the density, and the coverage can be controlled by applying the high frequency bias to the susceptor 2, although the conditions including the process pressure and the gas flow rates are equal. Specifically, as the high frequency bias is applied to the susceptor 2, the corner film thickness ratio can be 1 or more, and the uniformity of the film thickness can be improved by the small density difference in which the film thickness ratio due to the density is 90% or more. Also, it is possible to obtain the uniform and good coverage between dense and sparse portions of the pattern. As shown in FIG. 7, these effects were sufficiently obtained, even if the ratio ($L_1/L_2$) of an opening width $L_1$ of a depression at a sparse portion of the pattern 110 to an opening width $L_2$ of a depression at a dense portion of the pattern 110 ranged from 2 to 100, and even if the ratio (aspect ratio) of a depth to an opening width of a depression of the pattern 110 ranged from 0.02 to 1 at a sparse portion and ranged from 2 to 10, preferably from 5 to 10 at a dense portion.

Next, results of the measurement of corner film thickness ratios at a sparse portion and a dense portion of a pattern, in case that the frequency and power of the high frequency bias are varied, will be described.

Figure 10:
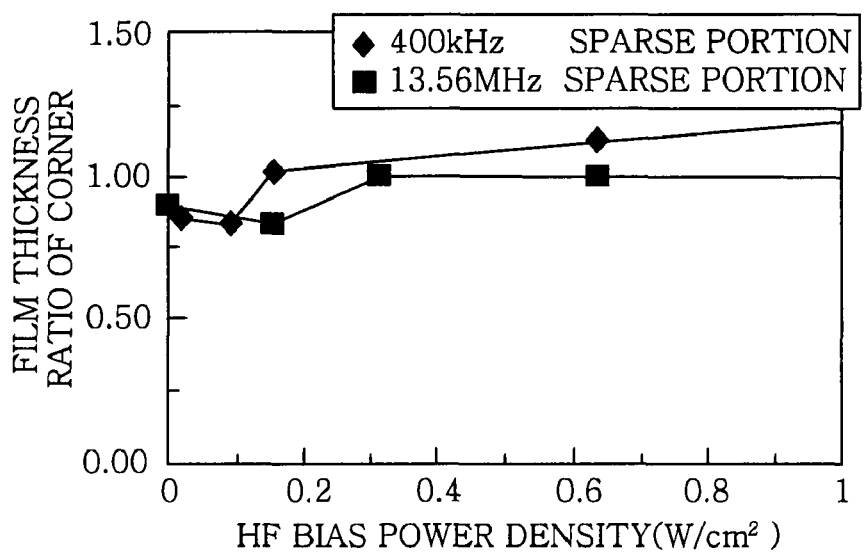
FIG. 10 illustrates a relationship between a high frequency bias power and a corner film thickness ratio at a sparse portion, in case that a frequency of bias is set to 400 kHz and 13.56 MHz.
Figure 11:
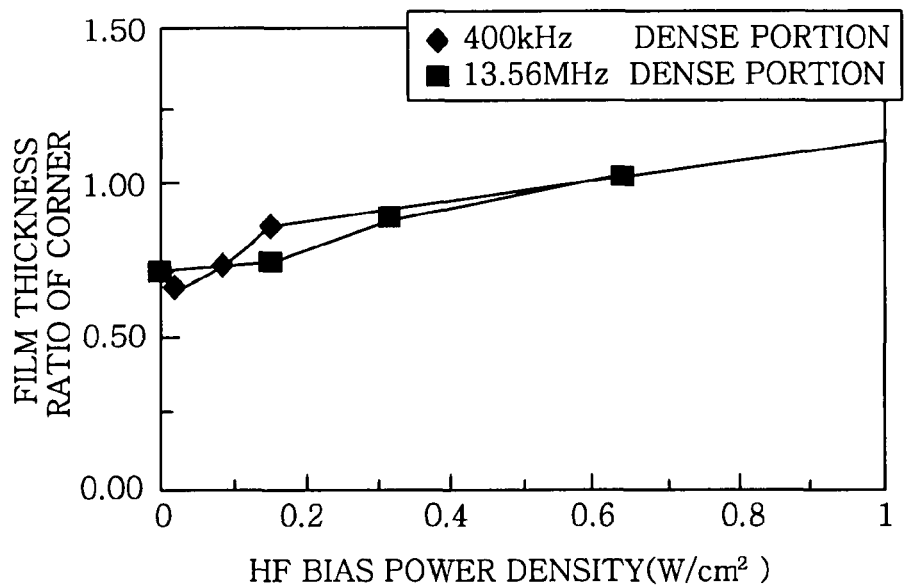
FIG. 11 illustrates a relationship between a high frequency bias power and a corner film thickness ratio at a dense portion, in case that a frequency of bias is set to 400 kHz and 13.56 MHz.
Figure 12:
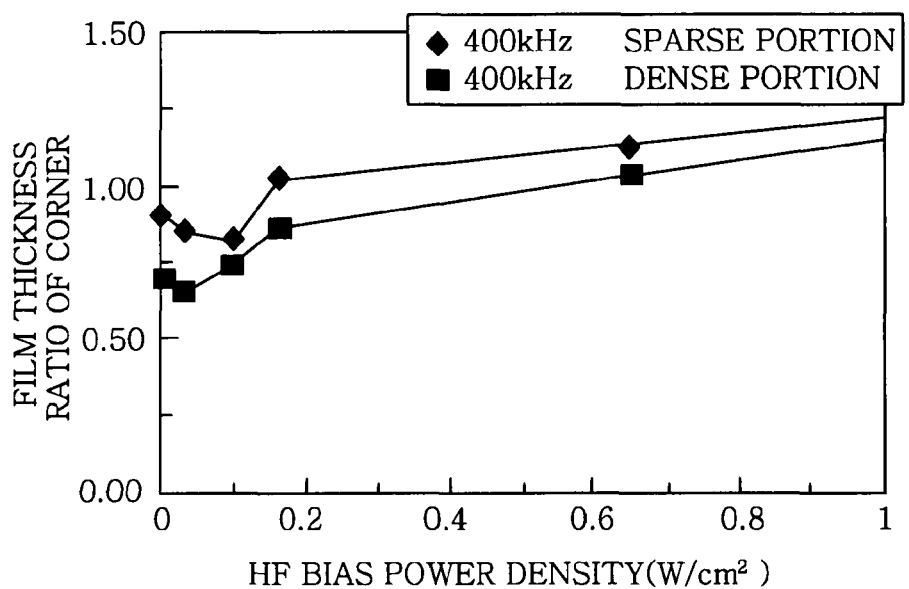
FIG. 12 illustrates a relationship between a high frequency bias power and a corner film thickness ratio at a sparse portion and a dense portion, in case that a frequency of bias is set to 400 kHz.
Figure 13:
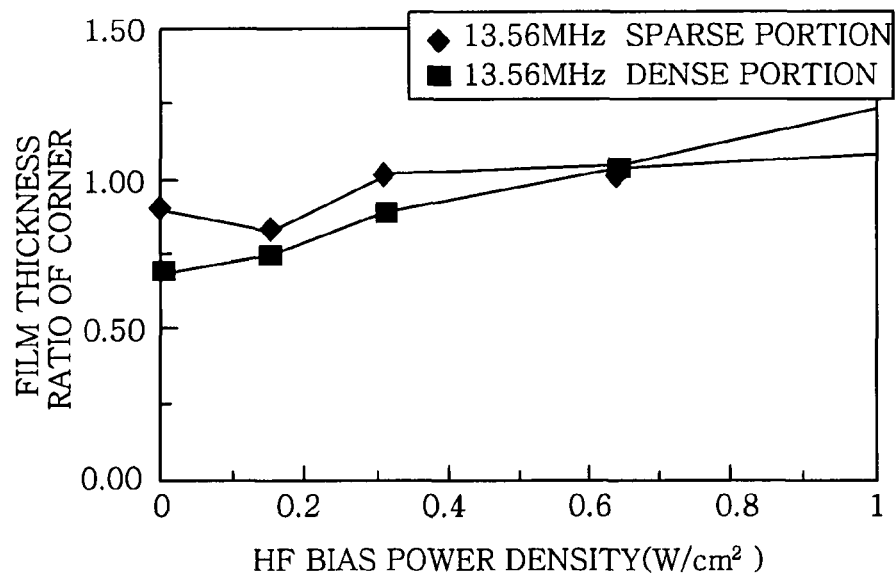
FIG. 13 illustrates a relationship between a high frequency bias power and a corner film thickness ratio at a sparse portion and a dense portion, in case that a frequency of bias is set to 13.56 MHz.

In this case, oxide films were formed on the surface of the pattern of FIG. 7 by using a wafer of 200 mm under a basic condition that the frequency of the high frequency bias was set to be 400 kHz and 13.56 MHz, the power of the bias was varied to 10, 50, 100, and 200 W (the power density was varied to 0, 0.031, 0.095, 0.159, 0.318, and 0.639 W/cm$^2$), and corner film thickness ratios (film thickness d'/film thickness b') at a dense portion of the pattern and corner film thickness ratios (film thickness d/film thickness b) at a sparse portion of the pattern were measured. FIGS. 10 to 13 show the obtained results. In each of FIGS. 10 to 13, the horizontal axis represents the power density of the high frequency bias, and the vertical axis represents the corner film thickness ratio. FIG. 10 illustrates corner film thickness ratios at a sparse portion, in case that a frequency of bias is set to be 400 kHz and 13.56 MHz. FIG. 11 illustrates corner film thickness ratios at a dense portion, in case that a frequency of bias is set to be 400 kHz and 13.56 MHz. FIG. 12 illustrates corner film thickness ratios at a sparse portion and a dense portion, in case that a frequency of bias is set to be 400 kHz. FIG. 13 illustrates corner film thickness ratios at a sparse portion and a dense portion, in case that a frequency of bias is set to be 13.56 MHz. As known from FIGS. 10 to 13, as the power increases at both 400 kHz and 13.56 MHz, the corner film thickness ratio increases, and the corner rounding effect is obtained by applying the bias and there is not a great difference of this effect between 400 kHz and 13.56 MHz. Further, as the power density of the bias increases, the film thickness ratio due to the density increases (i.e., the density difference decreases). It is known that ionization is low and a process margin becomes large when the frequency of the bias is high, and the bias having a frequency of 13.56 MHz is preferable to the bias having a frequency of 400 kHz from this viewpoint. Further, the high frequency bias can obtain its effect even at a minute power, but a power density of bias ranges preferably from 0.015 to 4.78 W/cm$^2$, and more preferably from 0.159 to 3.18 W/cm$^2$.

Next, test results of electrical characteristics (insulating properties) of a silicon oxide film will be described.

In this case, a silicon wafer of 200 mm was used as a substrate, and a high frequency bias, the power of which was varied to 0 to 200 W (power density: 0 to 0.64 W/cm$^2$), at a frequency of 400 kHz or 13.56 MHz was applied to the silicon wafer under the high-pressure and high-oxygen concentration condition in accordance with the present invention. Accordingly, a silicon oxide film serving as a gate oxide film was formed on the substrate (silicon wafer), and thus a MOS-capacitor was manufactured.

Specifically, the gate oxide film of the silicon oxide film having a thickness of 6 nm was formed on the silicon substrate (P-EPI), a poly-silicon film having a thickness of 300 nm serving as a gate electrode was formed on the gate oxide film, and thus the MOS-capacitor including N-MOS was manufactured by the conventional method.

In this case, a basic condition for forming the silicon oxide film was set as follows.

Ar flow rate: 1,200 mL/min(sccm) O$_2$ flow rate: 370 mL/min(sccm)
H$_2$ flow rate: 30 mL/min(sccm)
O$_2$ gas proportion to total gas: approximately 23%
H$_2$ gas proportion to total gas: approximately 1.9%
Process pressure: 667 Pa (5 Torr)
Microwave power density: 2.05 W/cm$^2$
Susceptor temperature: 465° C.

Further, for comparison, an MOS capacitor having a gate oxide film formed without applying bias to a silicon wafer under the low-pressure and low-oxygen concentration condition was manufactured, and an MOS capacitor having a gate oxide film formed through the thermal oxidation was manufactured. The low-pressure and low-oxygen concentration condition and the condition in the thermal oxidation were set as follows.

(a) Low-Pressure and Low-Oxygen Concentration Condition
Ar flow rate: 990 mL/min(sccm)
O$_2$ flow rate: 10 mL/min(sccm)
O$_2$ gas proportion to total gas: 1%
Process pressure: 133 Pa (1 Torr)
Microwave power density: 2.05 W/cm$^2$
Susceptor temperature: 465° C.

(b) Thermal Oxidation Condition (Using Water Vapor Generation (WVG) Method)
O$_2$ flow rate: 900 mL/min(sccm)
H$_2$ flow rate: 450 mL/min(sccm)
Process pressure: 15,000 Pa (112.5 Torr)
Process temperature: 950° C.

A time zero dielectric breakdown (TZDB) test and a time-dependent dielectric breakdown (TDDB) test of the above-manufactured MOS capacitors were carried out. In the TZDB test, voltage was applied under the condition that a cell size S was 25 mm$^2$ and a cell number N was 112 pts, and it was determined that the MOS capacitors pass the TZDB test if cells of 15 MV/cm$^2$ or more are 95% or more. Further, in the TDDB test, a value of charge to breakdown (Qbd) and a value of ΔEge were measured under the condition that a cell size S was 0.01 mm$^2$, a value of CCS was −0.1 A/cm$^2$, and a temperature was 120° C. Qbd is an index of reliability, and represents the total amount of charges passing through the oxide film until the hard breakdown of the oxide film is generated. Further, ΔEge is an index of electron trap, and represents the shift amount of an electric field after 50 seconds from the application of static current. Further, the TDDB test was conducted only to the cells, which have passed the TZDB test.

Figure 14:
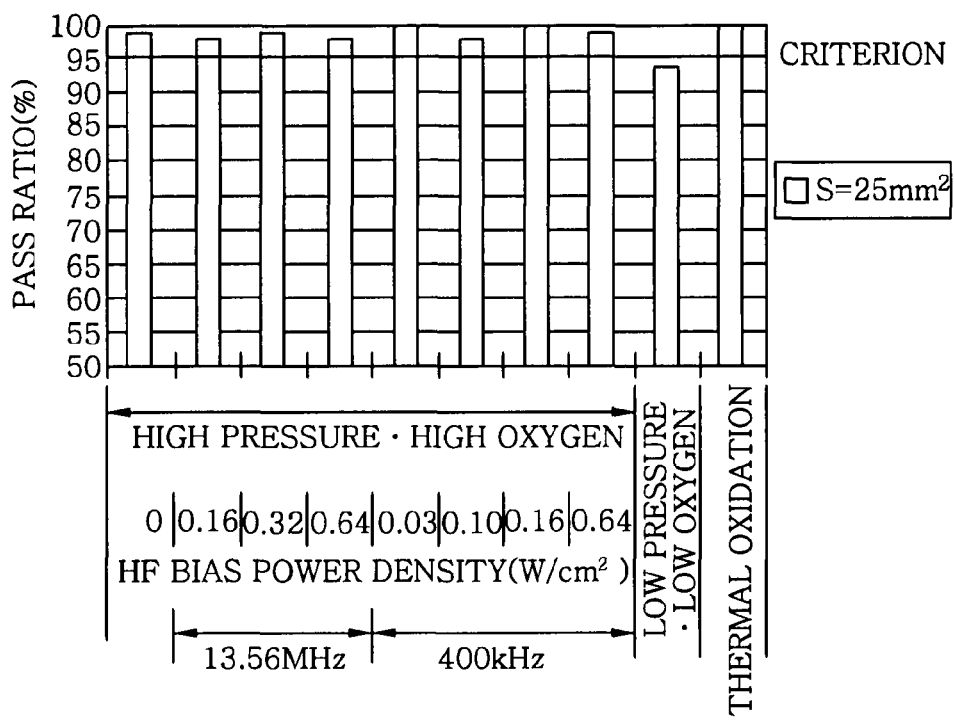
FIG. 14 illustrates results of a TZDB test.

FIG. 14 is a view illustrating results of the TZDB test. As shown in FIG. 14, the MOS capacitors formed under the high-pressure and high-oxygen concentration condition (expressed in high pressure·high oxygen) satisfied the passing line of 95% without depending on the application of the high frequency bias, and thus the TZDB test results of the MOS-capacitors formed under the high-pressure and high-oxygen concentration condition were equivalent to those of the MOS-capacitors formed by the thermal oxidation. Further, the MOS-capacitors formed under the low-pressure and low-oxygen concentration condition (expressed in low pressure·low oxygen) did not reach the passing line of 95%. The power density of the high frequency bias under the high-pressure and high-oxygen condition is preferably 0.015 W/cm$^2$ or more.

Figure 15:
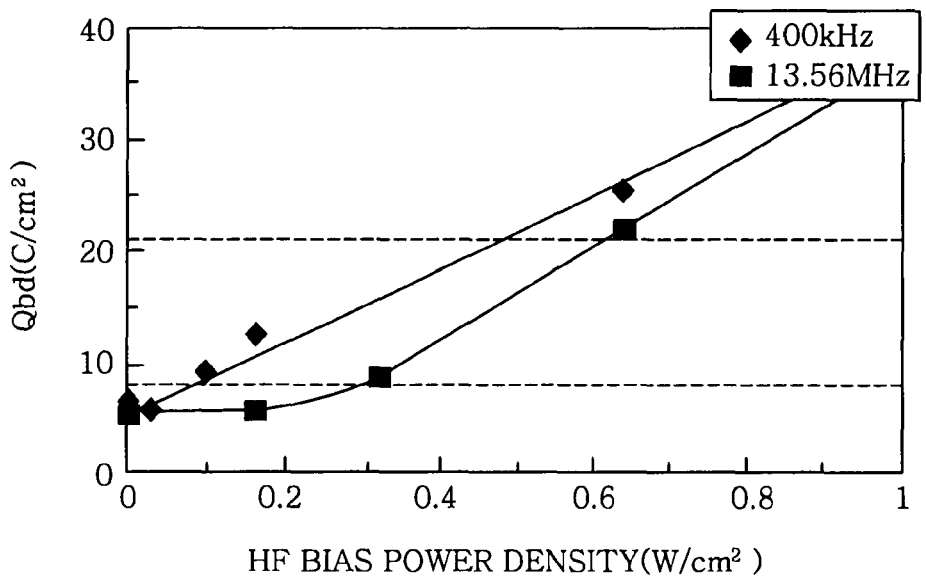
FIG. 15 illustrates a relationship between a high frequency bias power and a value of Qbd at each frequency.

FIG. 15 illustrates a relationship between a high frequency bias power, represented by the horizontal axis, and a value of Qbd, represented by the vertical axis, at each frequency. As shown in FIG. 15, values of Qbd at both 400 kHz and 13.56

MHz increase by applying the bias, compared with a value of Qbd in case that the bias is not applied, and the reliability is improved. Further, it is observed that the values of Qbd increase as the power of the high frequency bias increases. Further, it is confirmed that Qbd is increased to a value, being equivalent to or higher than a desired Qbd value obtained under the low-pressure and low-oxygen concentration condition, by appropriately selecting the power of the high frequency bias. Further, the frequency of 400 kHz is more effective than the frequency of 13.56 MHz in improving Qbd, but both 400 kHz and 13.56 MHz are sufficiently usable. The power density of the high frequency bias is preferably 0.015 W/cm$^2$ or more, more preferably 0.3 W/cm$^2$ or more, and even more preferably 0.6 W/cm$^2$ or more.

Figure 16:
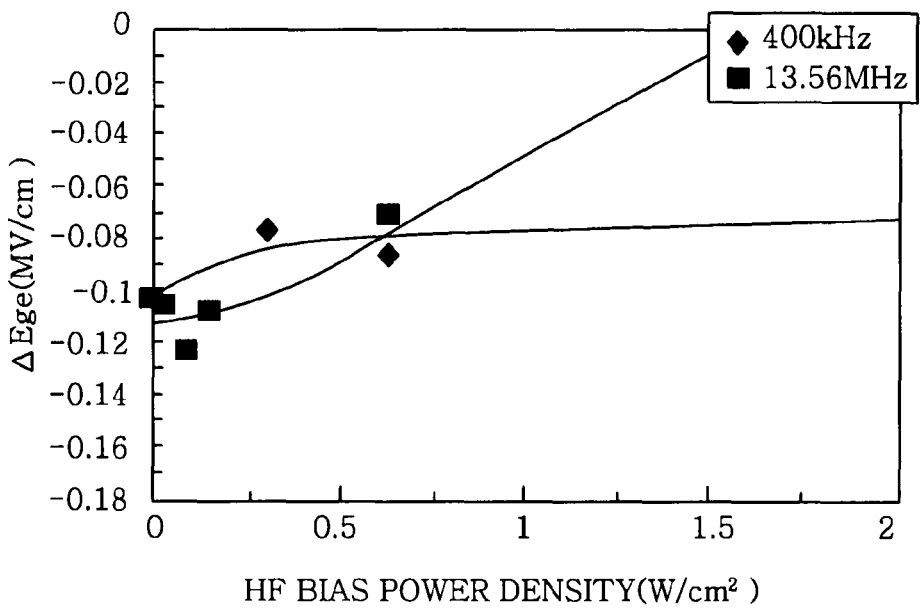
FIG. 16 illustrates a relationship between a high frequency bias power and a value of ΔEge at each frequency.

FIG. 16 illustrates a relationship between a high frequency bias power, represented by the horizontal axis, and a value of ΔEge, represented by the vertical axis, at each frequency. As shown in FIG. 16, it was confirmed that electron trap was reduced by applying high frequency biases of frequencies of 400 kHz and 13.56 MHz. Although both 400 kHz and 13.56 MHz are sufficiently usable, the absolute value of ΔEge at 13.56 MHz decreases as the bias power density increases and thus the frequency of 13.56 MHz is preferable.

Table 2 synthetically shows these results. As shown in Table 2, it was confirmed that an oxide film having both good time zero dielectric breakdown (TZDB) characteristic and good time-dependent dielectric breakdown (TDDB) characteristic, which could not be conventionally consistent with each other, and excellent electrical characteristics was formed under the state of the high-pressure and high-oxygen concentration condition+the high frequency bias application.

TABLE 2

| Condition | TZDB | TDDB | |
|---|---|---|---|
| | | Qbd | ΔEge |
| Low pressure and low oxygen concentration | X | ○ | Δ |
| high pressure and high oxygen concentration | ○ | X | X |
| Thermal oxidation | ○ | Δ | ○ |
| high pressure and high oxygen concentration + bias | ○ | ○ | Δ~○ |

As described above, it is confirmed that the oxide film formed by the method of the present invention has a high oxidation rate, a large corner rounding effect, a small plane direction difference, a small pattern density difference, excellent TZDB and TDDB characteristics, a dense film quality, and a good surface state, and thus the plasma oxidizing method of the present invention is remarkably excellent.

The present invention may be variously modified without being limited to the above embodiment. For example, although the above embodiment exemplifies an RLSA type plasma processing apparatus, other plasma processing apparatuses such as a remote plasma type plasma processing apparatus, an ICP plasma type plasma processing apparatus, an ECR plasma type plasma processing apparatus, a surface reflected wave plasma type plasma processing apparatus, a magnetron plasma type plasma processing apparatus or the like may be used.

Further, although the above embodiment exemplifies the formation of an oxide film in trenches in the STI process requiring the formation of an oxide film having a high quality on a pattern, having prominences and depressions, of a single-crystal silicon substrate, as shown in FIG. 7, the present invention may be applied to the formation of an oxide film having a high quality on the surfaces of other patterns having prominences and depressions, such as the formation of an oxide film on sidewalls of poly-silicon gate electrodes of transistors, and the formation of a silicon oxide film on the surface of a silicon substrate having different crystal plane directions according to portions due to prominences and depressions, e.g., the formation of a silicon oxide film serving as a gate insulating film in a manufacturing process of a three-dimensional transistor of a fin structure or a recess gate structure. Further, the present invention is not limited to the formation of the oxide film having the pattern with prominences and depressions, but may be applied to the formation of a gate oxide film of a gate electrode, or the formation of a tunnel oxide film of a flash memory.

Although the method of forming a silicon oxide film as an insulating film is described in the above embodiment, the silicon oxide film formed by the method of the present invention may be converted into a silicon oxynitride (SiON) film through a nitrification process. In this case, although no particular limitation is imposed on a nitrification method, it is preferable to perform a plasma nitrification process by using a gas mixture containing Ar gas and $N_2$ gas.

Further, although a silicon substrate, which is a semiconductor substrate, is used as an object to be processed in the above embodiment, other semiconductor substrates, such as a compound semiconductor substrate, or substrates for FPDs, such as an LCD substrate, an organic EL substrate or the like, may be used.

INDUSTRIAL APPLICABILITY

The present invention is preferably applied to the formation of a silicon oxide film in the manufacture of various semiconductor devices.

What is claimed is:
1. A plasma oxidizing method comprising:
mounting an object to be processed, having a surface containing silicon, on a mounting table disposed in a processing chamber of a plasma processing apparatus;
forming a plasma of a processing gas including oxygen in the processing chamber;
applying a high frequency bias to the object by supplying a high frequency power to the mounting table in formation of the plasma; and
forming a silicon oxide film by oxidizing the silicon in the surface of the object by using the plasma,
wherein the plasma is formed under the condition that a process pressure is 266 Pa to 1,333 Pa,
wherein an output of the high frequency power is 0.015 to 5 W/cm$^2$ per unit area of the object,
wherein the surface of the object has an uneven pattern with prominences and depressions,
wherein the proportion of oxygen in the processing gas ranges from 10 to 50%, and
wherein a process temperature ranges from 200 to 800° C.

2. The plasma oxidizing method of claim 1, wherein a frequency of the high frequency power ranges from 300 kHz to 60 MHz.

3. The plasma oxidizing method of claim 1, wherein the processing gas includes hydrogen in a proportion of 0.1 to 10%.

4. The plasma oxidizing method of claim 1, wherein the uneven pattern formed on the surface of the object includes sparse and dense portions having sparse and dense prominences and depressions.

5. The plasma oxidizing method of claim 1, wherein the silicon oxide film is formed such that a ratio ($t_c/t_s$) of a film thickness $t_c$ of the silicon oxide film formed at corners of upper ends of prominences of the uneven pattern to a film thickness $i_s$ of the silicon oxide film formed at side surfaces of the prominences is 0.9 or more.

6. A plasma oxidizing method comprising:
- mounting an object to be processed, having a surface containing silicon, on a mounting table disposed in a processing chamber of a plasma processing apparatus;
- forming a plasma in the processing chamber, under the condition that a proportion of oxygen in a processing gas is 10% or more and a process pressure ranges from 266 Pa to 1,333 Pa, by radiating a microwave from a planar antenna having plural slots into the processing chamber and introducing the processing gas including oxygen into the processing chamber, simultaneously;
- applying a high frequency bias to the object by supplying a high frequency power to the mounting table in formation of the plasma; and
- forming a silicon oxide film by oxidizing the silicon in the surface of the object by using the plasma,
- wherein an output of the high frequency power ranges from 0.015 to 5 W/cm$^2$ per unit area of the object,
- wherein the surface of the object has an uneven pattern with prominences and depressions,
- wherein the proportion of oxygen in the processing gas ranges from 10 to 50%, and
- wherein a process temperature ranges from 200 to 800° C.

7. The plasma oxidizing method of claim 6, wherein the high frequency bias is controlled such that a time zero dielectric breakdown (TZDB) characteristic and a time-dependent dielectric breakdown (TDDB) characteristic of the formed silicon oxide film respectively have desired values.

8. The plasma oxidizing method of claim 6, wherein a frequency of the high frequency power ranges from 300 kHz to 60 MHz.

9. The plasma oxidizing method of claim 6, wherein the processing gas includes hydrogen in a proportion of 0.1 to 10%.

10. The plasma oxidizing method of claim 6, wherein the uneven pattern formed on the surface of the object includes sparse and dense portions having sparse and dense prominences and depressions.

11. The plasma oxidizing method of claim 6, wherein the silicon oxide film is formed such that a ratio ($t_c/t_s$) of a film thickness $t_c$ of the silicon oxide film formed at corners of upper ends of prominences of the uneven pattern to a film thickness $t_s$ of the silicon oxide film formed at side surfaces of the prominences is 0.9 or more.

12. A plasma oxidizing method comprising:
- applying a high frequency bias to an object to be processed having an uneven surface containing silicon; and
- forming a silicon oxide film by oxidizing the silicon in the surface of the object by using a plasma of a processing gas including oxygen generated while applying the high frequency bias,
- wherein a power density of the high frequency bias ranges from 0.015 to 5 W/cm$^2$ in application of the high frequency bias to the object, and
- wherein the plasma is formed under the condition that a process pressure is 266 Pa to 1.333 Pa.

* * * * *

UNITED STATES PATENT AND TRADEMARK OFFICE
CERTIFICATE OF CORRECTION

PATENT NO. : 7,910,495 B2
APPLICATION NO. : 12/443589
DATED : March 22, 2011
INVENTOR(S) : Toshihiko Shiozawa et al.

It is certified that error appears in the above-identified patent and that said Letters Patent is hereby corrected as shown below:

In column 19, line 5, change "thickness $i_s$" to --thickness $t_s$--.

Signed and Sealed this
Thirty-first Day of May, 2011

David J. Kappos
*Director of the United States Patent and Trademark Office*